United States Patent
Miyazaki et al.

[11] Patent Number: 5,449,547
[45] Date of Patent: Sep. 12, 1995

[54] HARD COATING MATERIAL, SLIDING MEMBER COATED WITH HARD COATING MATERIAL AND METHOD FOR MANUFACTURING SLIDING MEMBER

[75] Inventors: Satomichi Miyazaki, Okaya; Nobuyuki Yamashita; Shoji Tanaka, both of Shiojiri; Hiroto Fukutome, Okaya; Hiroshi Tamagaki, Kobe, all of Japan

[73] Assignees: Teikoku Piston Ring Co., Ltd., Tokyo; Kabushiki Kaisha Kobe Seiko Sho, Kobe, both of Japan

[21] Appl. No.: 207,049

[22] Filed: Mar. 8, 1994

[30] Foreign Application Priority Data

Mar. 15, 1993 [JP] Japan ................. 5-080183
Apr. 8, 1993 [JP] Japan ................. 5-106238

[51] Int. Cl.$^6$ ............ B32B 15/04; B32B 18/00; H01R 13/03
[52] U.S. Cl. ............ 428/217; 428/472; 428/472.1; 428/689; 428/698; 428/702; 29/888.074; 427/523; 427/528; 427/530; 106/286.1
[58] Field of Search ............ 428/698, 702, 472.1, 428/217, 689, 472; 205/156; 106/286.1; 427/255.1, 523, 528, 529, 530; 29/888.074, 888.048, 898.12, 898.13; 501/132; 204/192.11, 192.16

[56] References Cited

U.S. PATENT DOCUMENTS

| 4,486,285 | 12/1984 | Aubert et al. | 204/192 |
| 4,720,442 | 1/1988 | Shinkai | 430/5 |
| 4,765,847 | 8/1988 | Arai | 148/15.5 |
| 4,818,351 | 4/1989 | Arai | 204/39 |
| 4,918,806 | 4/1990 | Watanabe | 148/16.5 |
| 4,943,486 | 7/1990 | Uchiyama | 428/469 |
| 4,966,751 | 10/1990 | Kaede | 420/34 |
| 5,015,537 | 5/1991 | Uchiyama | 428/623 |
| 5,077,091 | 12/1991 | Nowak | 427/255.2 |
| 5,085,926 | 2/1992 | Iida | 428/216 |
| 5,316,321 | 5/1994 | Ishida | 277/235 A |

FOREIGN PATENT DOCUMENTS

| 0149449A1 | 7/1985 | European Pat. Off. . | |
| 0416887A2 | 3/1991 | European Pat. Off. . | |
| 438916 | 7/1991 | European Pat. Off. | 428/698 |
| 0470359A2 | 2/1992 | European Pat. Off. . | |
| 125343 | 9/1980 | Japan | 29/888.048 |
| 60-224773 | 11/1985 | Japan . | |
| 62-83461 | 4/1987 | Japan . | |

OTHER PUBLICATIONS

WPI Abstract Accession No: 85-273074/44 & JP 600184672 A.
WPI Abstract Accession No: 85-161646/27 & JP 600091356 A.

*Primary Examiner*—Ellis P. Robinson
*Assistant Examiner*—Leonidas J. Jones, III
*Attorney, Agent, or Firm*—Armstrong, Westerman, Hattori, McLeland & Naughton

[57] ABSTRACT

A hard film 2 is applied to cover an outer circumferential surface of a piston ring 1 by an ion plating process. Either 3 percent to 20 percent by weight of oxygen, or 2 percent to 11 percent by weight of carbon is included in a solid solution state in a crystal structure of CrN in the hard film 2. The Vickers hardness of the hard film 2 is in a range of 1600 to 2200.

5 Claims, 11 Drawing Sheets

HARD COATING MATERIAL, SLIDING MEMBER COATED WITH HARD COATING MATERIAL AND METHOD FOR MANUFACTURING SLIDING MEMBER

BACKGROUND OF THE INVENTION

1. Field of the Invention

This invention relates to an improved hard coating material having toughness and slideability characteristics and also to sliding members such as internal combustion engine piston rings having a film of the hard coating material.

2. Description of the Related Art

In recent years, piston rings have been subject to harsh operating environments due to demands for increased engine output and reduced exhaust gas emissions. Many engines using present methods such as hard chromium plating and nitriding treatment for surface processing of sliding surfaces, are not durable enough to withstand this harsh environment. A hard film of materials such as TiN and CrN using physical vapor deposition process has been proposed. A thick film of CrN in particular has been employed to meet demands for engines with increased durability.

The CrN film shows superior wear resistance and scuffing resistance. This film is easy to mass produce and available in layers exceeding 30 μm. However since the CrN film is brittle, excessive repetitive stress on the sliding surfaces during operation generate cracks, which may cause peeling.

SUMMARY OF THE INVENTION

It is an object of the present invention to improve the sliding characteristics and toughness of CrN (chromium nitride) used as a hard coating material.

The hard coating material of the present invention is made such that either 3 percent to 20 percent by weight of oxygen, or 2 percent to 11 percent by weight of carbon is included in a solid solution state in a crystal structure of CrN, and the Vickers hardness of the hard coating material is in a range of 1600 to 2200 HV. The hard coating material of the present invention has superior wear resistance, scuffing resistance and toughness.

Accordingly, the hard film composed of the aforesaid hard coating material is applied to cover at least the sliding surface of for example a piston ring, giving the piston ring sufficient durability even under severe conditions. Application of the aforesaid hard coating material can be performed by an ion plating process.

DESCRIPTION OF THE PREFERRED EMBODIMENTS

Figure 1:
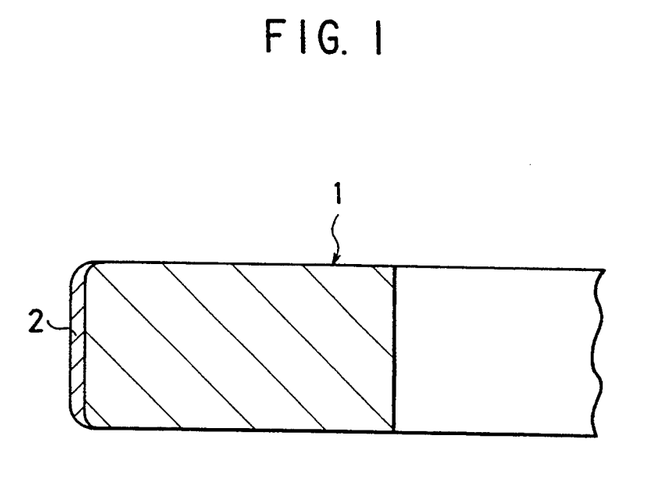
FIG. 1 is a longitudinal sectional view showing a part of a piston ring of one preferred embodiment of the present invention.

In FIG. 1, a piston ring 1 is a ring having a rectangular cross section which is made of steel, cast iron, titanium or titanium alloy and the like. The outer circumferential surface of the piston ring 1 is coated with a hard film 2 by an arc ion plating process. The hard film 2 is made such that oxygen is included in a solid solution state in a crystal structure of CrN at a rate of 3 percent to 20 percent by weight and the Vickers hardness of the hard film is in a range of 1600 to 2200 HV. Thickness of the hard film 2 is preferably in a range of 10 μm to 70 μm.

The arc ion plating process is one type of ion plating, wherein a film material is vaporized, ionized by vacuum arc discharge to form a film on the surface of the substrate. This arc ion plating process is characterized by a high ionization rate of the vapor allowing forming of a highly adhesive, high density film.

Figure 2:
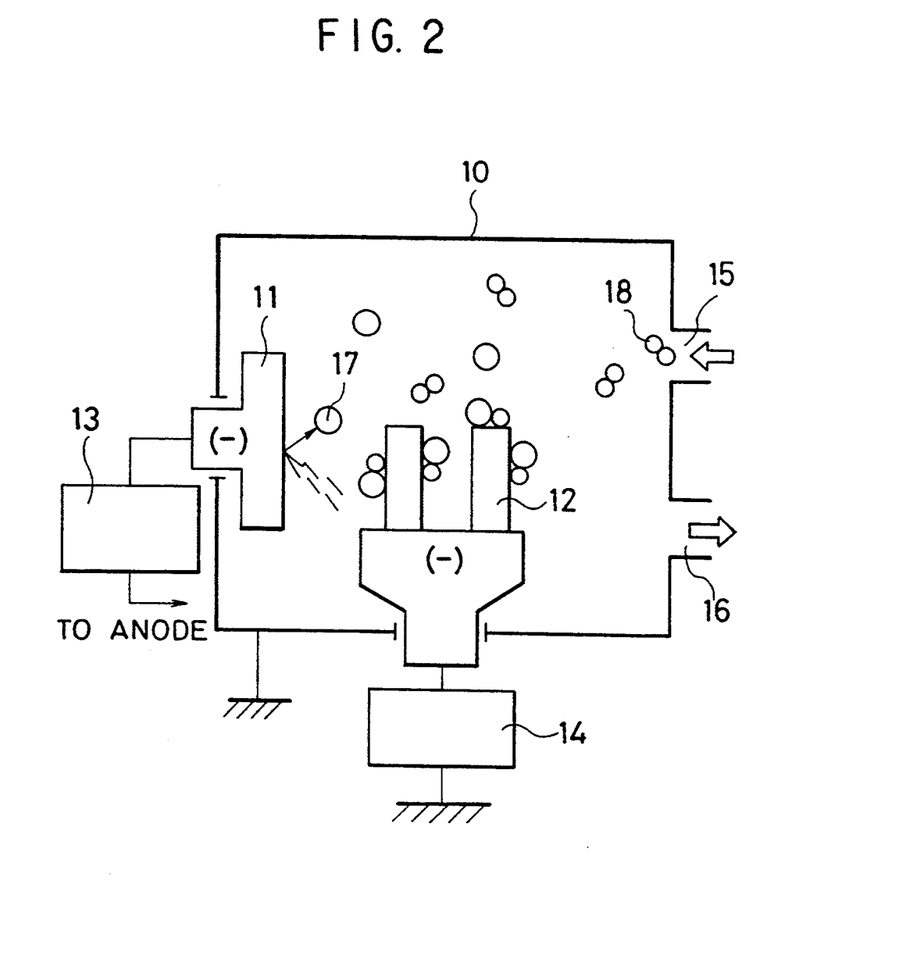
FIG. 2 is a view illustrating a configuration of an arc ion plating apparatus.

A basic configuration of an arc ion plating apparatus will be described in reference to FIG. 2. A cathode 11 composed of a film material and a substrate 12 on which film is formed, are mounted in a vacuum chamber 10. The cathode 11 is connected to an arc supply source 13 installed outside the vacuum chamber 10, and an anode (not shown in the figure) is connected to the arc supply source 13. A negative bias voltage is applied to the substrate 12 by a bias voltage supply source 14. The vacuum chamber 10 is provided with a gas inlet 15 connected to process gas supply source and a discharging outlet 16 connected to a pump.

Accordingly, at the start of arc discharge between the cathode 11 and the anode in the vacuum chamber 10, the arc concentrates into a point (arc spot) on the surface of the cathode 11, and moves around randomly and fast on the surface of the cathode 11. The energy of the arc current (several tens of amperes to several hundreds of amperes) concentrated in the arc spot instantaneously evaporates and ionizes the material of the cathode 11 to generate metallic ions 17 released into the vacuum space. Then, a negative bias voltage which is applied to the substrate 12 accelerates the metallic ions 17 to tightly adhere together with reactive gases 18 on the surface of the substrate 12, thereby producing an extremely fine coating.

In the preferred embodiment, in the aforesaid arc ion plating apparatus, chromium metal is used as a material of the cathode 11, and nitrogen gas and oxygen gas are used as process gases, thereby a piston ring can be coated with the hard film in which oxygen is included in a solid solution state in a crystal structure of CrN.

Control of the oxygen concentration can be performed by adjusting the partial pressure of oxygen in the ion plating process. As the partial pressure of oxygen is raised, the oxygen concentration increases.

Control of the film hardness can be performed by adjusting the partial pressure of oxygen and adjusting the bias voltage in the ion plating process. As the partial pressure of oxygen is raised, the film hardness increases (see Table 1). In addition, as the bias voltage is raised, the film hardness increases. (See Table 2).

TABLE 1

| Bias voltage: 5 V | |
|---|---|
| Concentration of oxygen (%) | Hardness of film ($HV_{0.1}$) |
| 7.3 | 1838 |
| 10.0 | 2059 |
| 13.3 | 2131 |

TABLE 2

| Concentration of oxygen: 7.3% | |
|---|---|
| Bias voltage (V) | Hardness of film ($HV_{0.1}$) |
| 3 | 1776 |
| 5 | 1838 |
| 10 | 1854 |

Figure 3A:
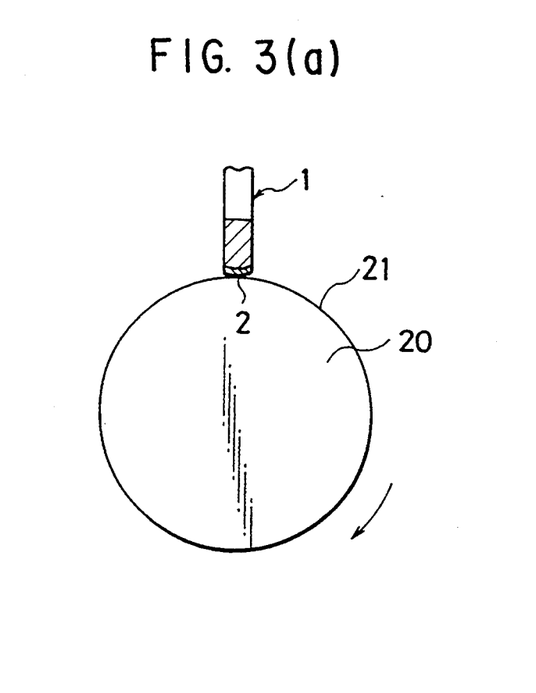
FIG. 3(a) is a front elevational view partly in section showing an outline of a pin-on-cylinder friction testing machine.
Figure 3B:
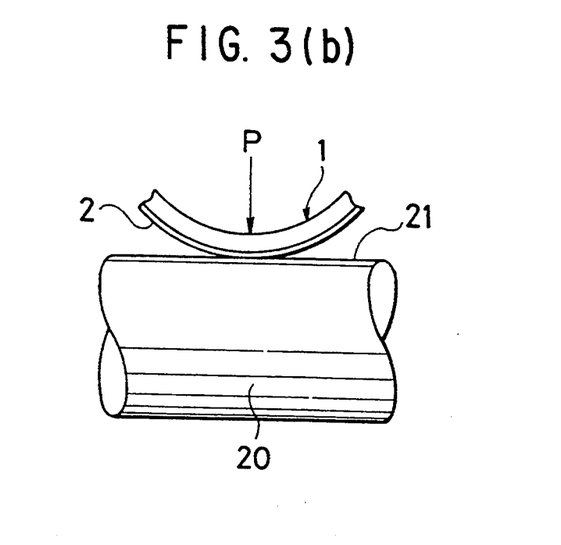
FIG. 3(b) is a side elevational view of FIG. 3(a).

In order to evaluate the toughness of the aforesaid hard film 2, a pin-on-cylinder friction testing machine was used to perform a film toughness evaluation test. An outline of the test using the pin-on-cylinder friction testing machine will be described in reference to FIG. 3.

The piston ring 1 is arranged along an axis of a rotor 20 at the upper end of the outer circumferential surface 21 of the rotor 20 (cast iron material: JIS FC 250) rotated around the horizontal axis. A load P is applied to the piston ring 1 to push the piston ring 1 against the outer circumferential surface 21 of the rotor 20. Under this state, the rotor 20 is rotated while lubricant oil is supplied to the contact portion between the piston ring 1 and the rotor 20.

Slide speed was measured when cracks occurred in the hard film of the piston ring 1 when the speed of the rotor 20 was varied. Measurement was performed for eight kinds of piston rings having different amounts of oxygen in the film. The thickness of the hard film of the piston ring used in the measurement was 50 μm and surface roughness of the film was 0.6 μmRz.

Measurement of oxygen in the CrN film was mainly performed by EPMA (electron probe microanalyzer) and confirmed by ESCA (electron spectroscopy for chemical analysis).

Test conditions were as follows.
Lubricant oil: Hi-Diesel S3 10W Engine Oil (NIPPON OIL CO., LTD.)
Load (P): 2.25 KgF
Slide Speed: Varied in a range of 0 m/s to 7 m/s
Temperature: Room temperature Table 3 indicates the results of the test and a graph of the same results is given in FIG. 4.

TABLE 3

| Oxygen content of film (wt. %) | Slide speed when cracks occurred in the film (m/s) |
|---|---|
| 0.0 | 3.5 |
| 0.9 | 5.0 |
| 2.9 | 5.5 |
| 4.4 | 7.0 or more |
| 8.5 | 7.0 or more |
| 10.4 | 7.0 or more |
| 15.7 | 7.0 or more |
| 23.0 | 5.0 |

No cracks occurred at a slide speed of 7 m/s for film oxygen contents of 4.4, 8.5, 10.4 and 15.7 percent.

Figure 4:
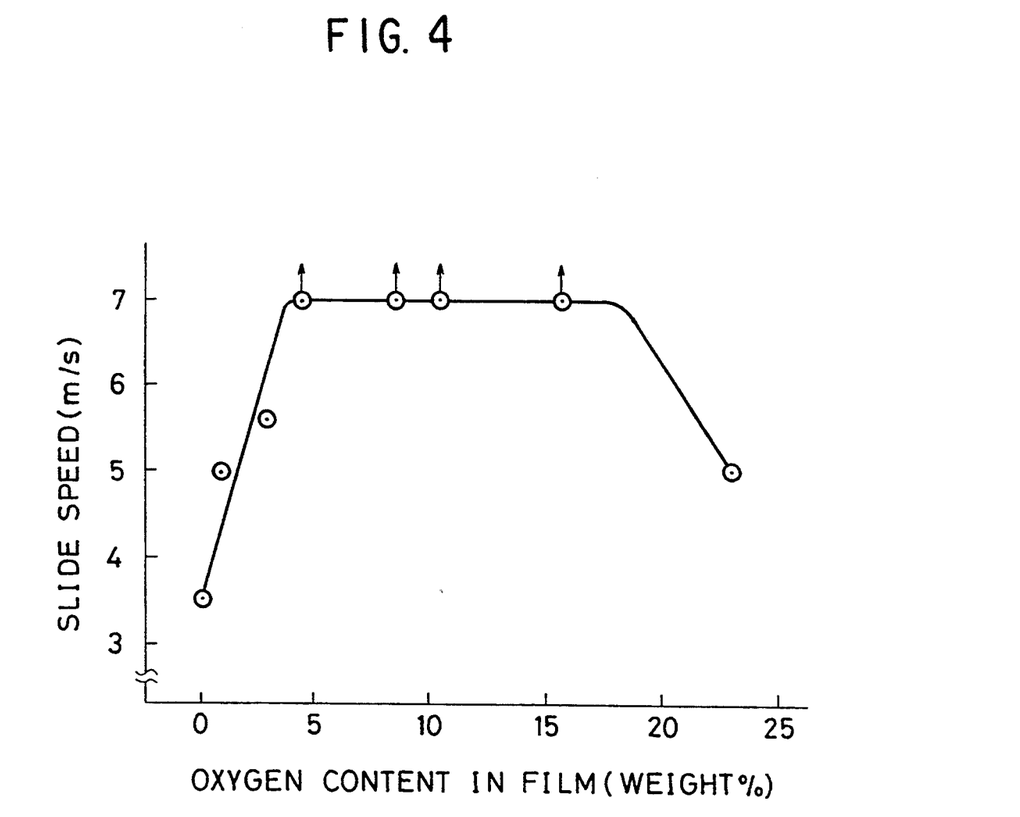
FIG. 4 is a graph illustrating the test results performed with a pin-on-cylinder friction testing machine.

As indicated by the test results in FIG. 4, toughness of the film during sliding was found to be improved by including oxygen in the CrN.

Figure 5:
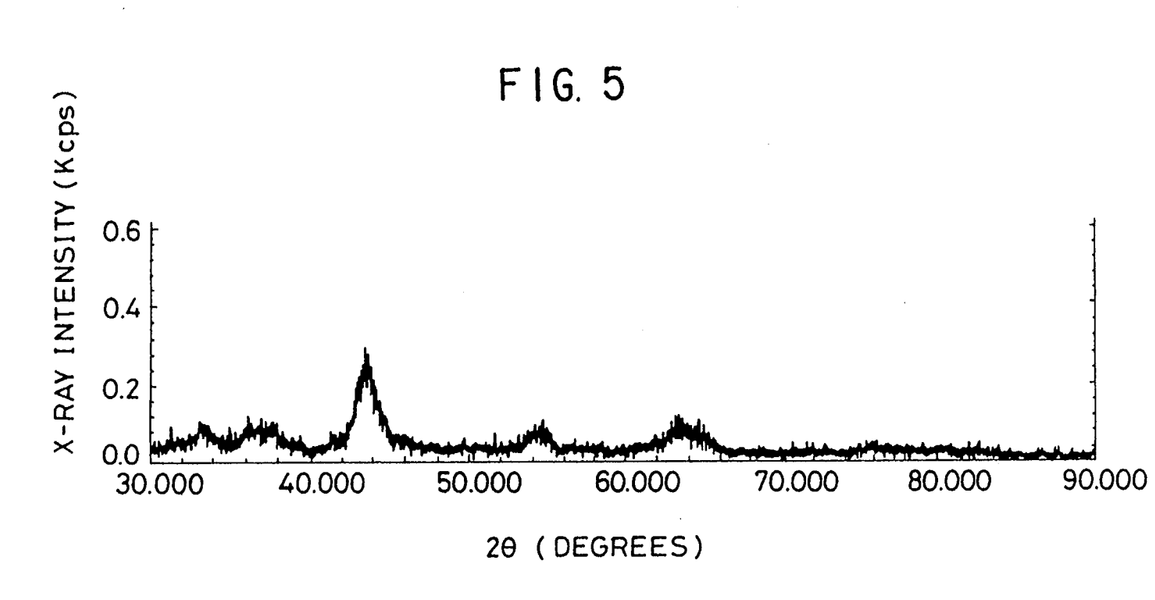
FIG. 5 is a view showing a X-ray diffraction pattern of the hard film in which oxygen is included in a solid solution state in a crystal structure of CrN at a rate of 23 percent by weight.
Figure 6:
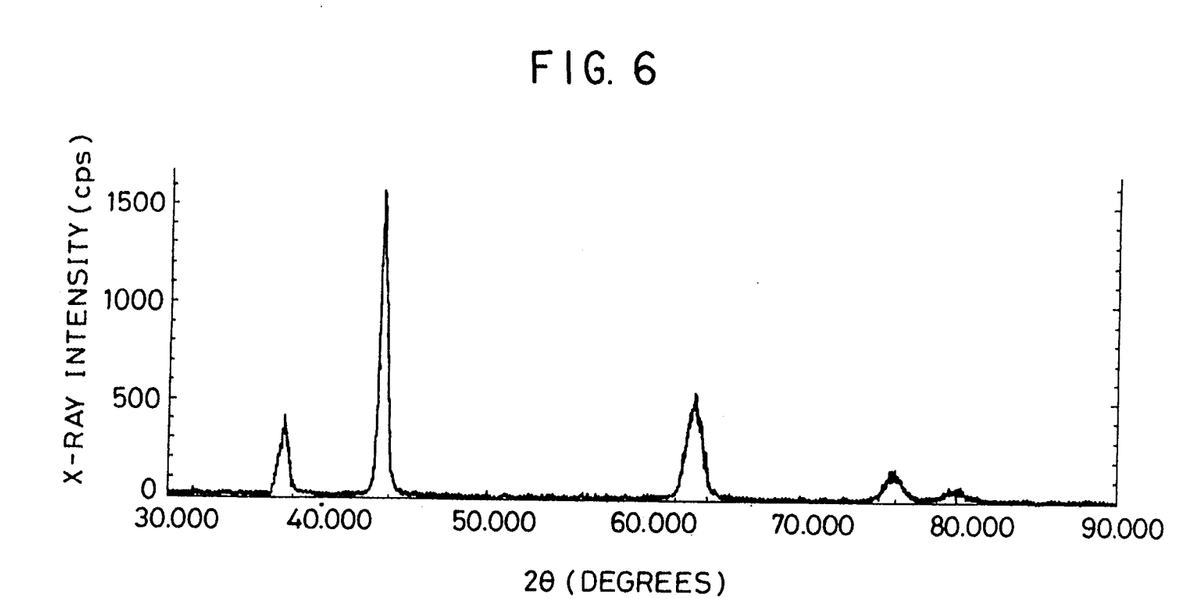
FIG. 6 is a view showing a X-ray diffraction pattern of the hard film in which oxygen is included in a solid solution state in a crystal structure of CrN at a rate of 10 percent by weight.

In order to maintain sufficient toughness in the hard film in the preferred embodiment, the oxygen content in the CrN was set at 3.0 percent or more by weight. As shown in FIG. 5, when the oxygen content was 23 percent or more by weight, the appearance of peaks for $Cr_2O_3$ (dichromium trioxide) as well as for CrN in the X-ray diffraction pattern (X-ray tube: copper) showed deterioration in film toughness. Therefore an oxygen upper limit of 20 percent by weight was set. FIG. 6 indicates the X-ray diffraction pattern (X-ray tube: copper) when the oxygen content was 10 percent by weight and diffraction peak for $Cr_2O_3$ does not appear. CrN has a NaCl type crystal structure. $Cr_2O_3$ has an orthorhombic crystal structure.

The hard film is not high-density and contains defects such as pits, with a hardness lower than HV 1600. Since peeling may occur in the manufacturing process at a hardness in excess of HV 2200, film hardness was set within a Vickers hardness range of 1600 to 2200 HV.

Next, in order to evaluate the scuffing characteristics of the hard film, a high surface pressure scuffing testing machine was used. An outline of the test using the high surface pressure scuffing testing machine will be described in reference to FIG. 7.

Figure 7:
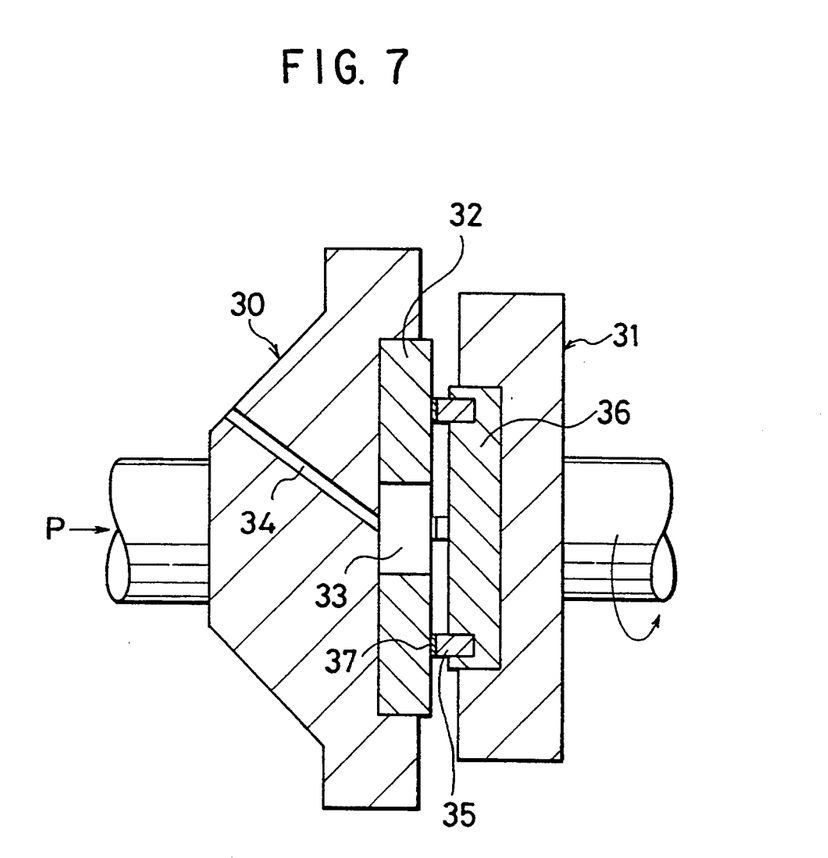
FIG. 7 is a longitudinal sectional view showing an outline of a high surface pressure scuffing testing machine.

A stator 30 has a circular concave part at a surface facing a rotor 31 to be described later. A disk 32 (cast iron material: JIS FC 250) is fixed to the concave part. The disk 32 is projected toward the rotor 31. The surface of the disk 32, facing the rotor 31 forms a vertical flat surface. The disk 32 has an oil hole 33 at its central part in the axial direction of the stator 30. The stator 30 has an oil hole 34 communicated with the oil hole 33 in a slant direction. Lubricant oil is supplied to the contact portions between the disk 32 of the stator 30 and pins 35 to be described later, through these oil holes 33 and 34.

The rotor 31 is rotated around the horizontal axis and has a circular concave part at the surface facing the stator 30. A pin holder 36 is concentrically fixed to the rotor 31 at the concave part. At the surface of the pin holder 36 facing the stator 30 are formed four concave parts equally spaced apart on the same circle. Each of the pins 35 (8 mmφ) is inserted into these concave parts as test pieces, and fixed there. Each of the pins 35 is projected horizontally from the surface of the pin holder 36 toward the stator 30.

The projecting end surface of each of the pins 35 is formed with various kinds of surface treatment films 37 and their end surfaces are in contact with the surface of the disk 32 of the stator 30.

Accordingly, a load P is applied to the stator 30 to push the disk 32 against the pins 35. The rotor 31 is then rotated while lubricant oil is supplied to the contact portions between the pins 35 and the disk 32 through the oil holes 33 and 34.

When the load P was varied with the slide speed of the rotor 31 kept constant, the load when the pin 35 was scuffed was measured. Scuffing tests were performed for pins (member for comparison) having, respectively, a hard chromium plating film, a nitrided layer of stainless steel, and a CrN film in which oxygen is not included, and a pin (the present invention) provided with a CrN film in which oxygen is included in a solid solution state under the following test conditions.

The test conditions were as follows.
Lubricant oil: Hi-Diesel S3 10W Engine oil (NIPPON OIL CO., LTD.); Oil temperature 80° C.
Load (P): Increased by 10 kgf from an initial load of 20 kgf at a time interval of 3 minutes
Slide speed: 8 m/s constant
Temperature: Room temperature.

Figure 8:
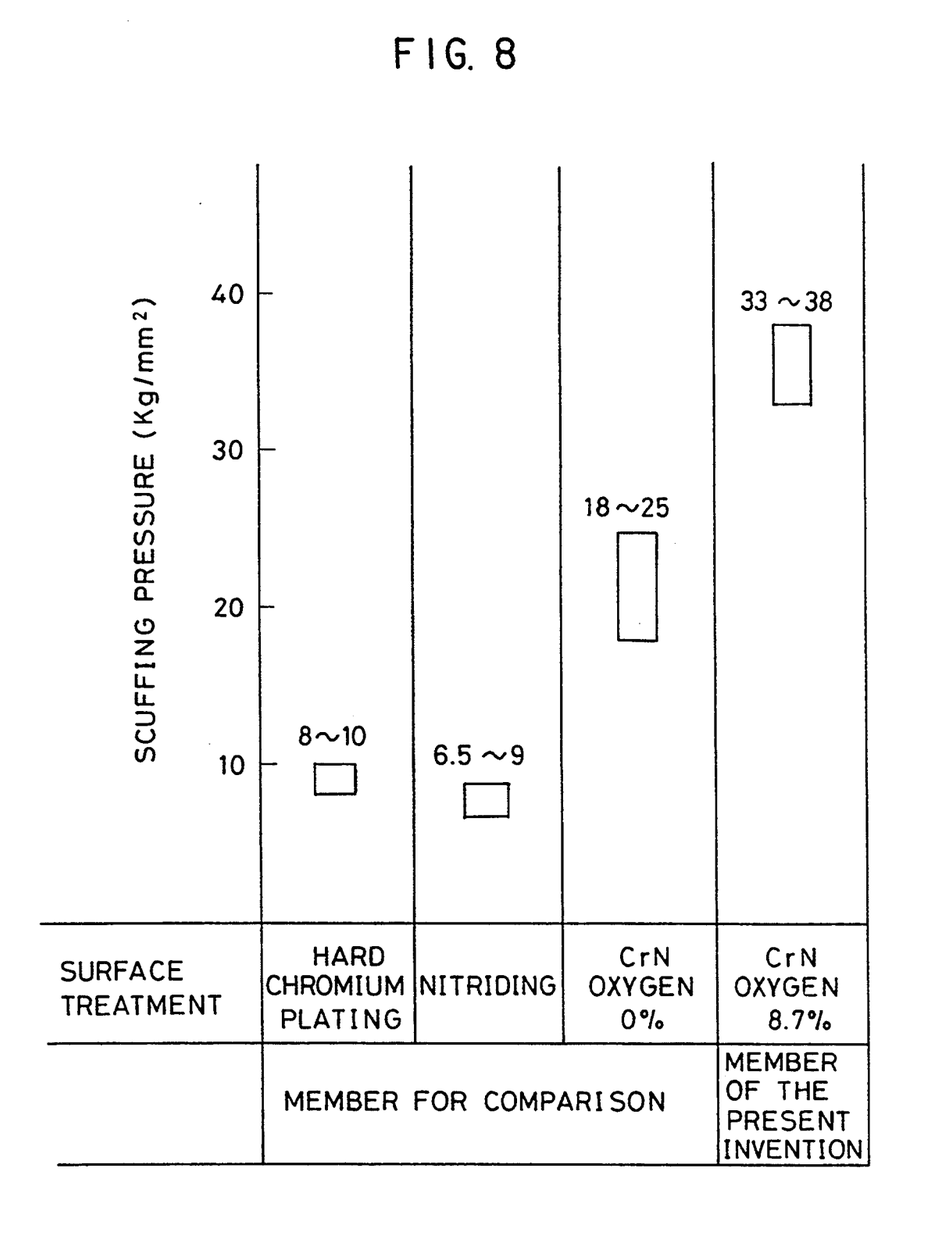
FIG. 8 is a graph illustrating the test results performed with a high surface pressure scuffing testing machine.

As indicated by the test results in FIG. 8, it is apparent that the CrN film is superior to the hard chromium plating film or the nitrided layer in scuffing resistance. In addition, it is apparent that of the CrN film, the film of the present invention containing oxygen is superior in scuffing resistance, to the film containing no oxygen.

Figure 9:
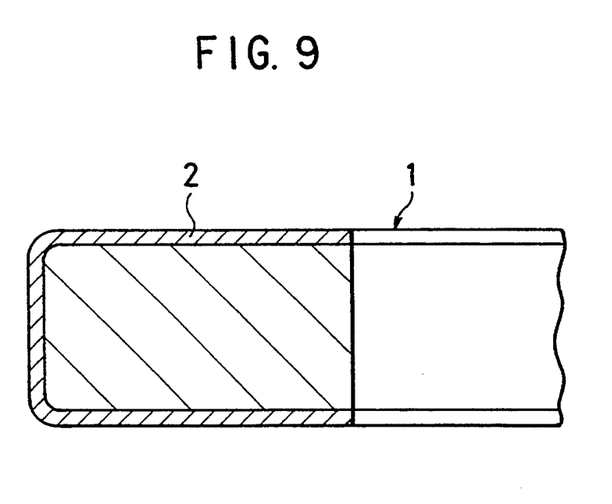
FIG. 9 is a longitudinal sectional view showing a part of a piston ring of another preferred embodiment of the present invention.

FIG. 9 is a longitudinal sectional view showing a part of a piston ring of another preferred embodiment of the present invention. The outer circumferential surface and the upper and lower surfaces of a piston ring 1 in this preferred embodiment are coated with a hard film 2 by an arc ion plating process. The hard film 2 is made such that oxygen is included in a solid solution state in a crystal structure of CrN at a rate of 3 percent to 20 percent by weight and the Vickers hardness of the hard film is in a range of 1600 to 2200 HV. Thickness of the hard film 2 is preferably in a range of 10 μm to 70 μm.

Figure 10:
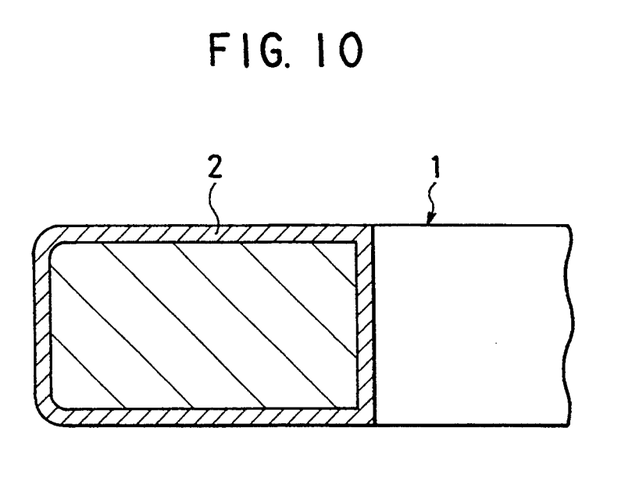
FIG. 10 is a longitudinal sectional view showing a part of a piston ring of a still further preferred embodiment of the present invention.

FIG. 10 is a longitudinal sectional view showing a part of a piston ring of a still further preferred embodiment of the present invention. The outer circumferential surface, the upper and lower surfaces and the inner circumferential surface of a piston ring 1 of this preferred embodiment are coated with a hard film 2 by an arc ion plating process. The hard film 2 is made such that oxygen is included in a solid solution state in a crystal structure of CrN at a rate of 3 percent to 20 percent by weight, and the Vickers hardness of the hard film is in a range of 1600 to 2200 HV. Thickness of the hard film 2 is preferably in a range of 10 μm to 70 μm.

Although the aforesaid preferred embodiment shows the hard film in which oxygen is included in a solid solution state in a crystal structure of CrN, the hard film is not limited to this configuration. Another hard film will be described as follows. This hard film is made such that carbon is included in a solid solution state in a crystal structure of CrN at a rate of 2 percent to 11 percent by weight and the Vickers hardness of the hard film is in a range of 1600 to 2200 HV. Thickness of the hard film is preferably in a range of 10 μm to 70 μm. This hard film is also applied to cover at least the outer circumferential surface of a piston ring.

Application of this hard film can be performed by the aforesaid arc ion plating apparatus. That is, chromium metal is used as a material for the cathode 11 as shown in FIG. 2, and nitrogen gas and methane gas are used as process gases. A piston ring can thereby be coated with a hard film in which carbon is included in a solid solution state in a crystal structure of CrN.

Control of the carbon concentration can be performed by adjusting the partial pressure of methane in the ion plating process. As the partial pressure of methane is raised, the carbon concentration increases.

Control of film hardness can be performed by adjusting the partial pressure of methane, and adusting the bias voltage in the ion plating process. As the partial pressure of methane is raised, the film hardness increases (see Table 4). In addition, as the bias voltage is raised, the film hardness increases (see Table 5).

TABLE 4

| Bias voltage: 10 V | |
|---|---|
| Concentration of methane (%) | Hardness of film ($HV_{0.1}$) |
| 5 | 1650 |
| 20 | 1820 |
| 30 | 1900 |

TABLE 5

| Concentration of methane: 10 % | |
|---|---|
| Bias voltage (V) | Hardness of film ($HV_{0.1}$) |
| 5 | 1730 |
| 10 | 1800 |
| 30 | 1980 |

In order to evaluate the toughness of the hard film, a film toughness evaluation test was performed using the aforesaid pin-on-cylinder friction testing machine.

The slide speed was measured when cracks occurred in the hard film of the piston ring 1 when the speed of the rotor 20 was varied in the same manner as that of the aforesaid process. Measurement was performed for seven kinds of piston rings having different amounts of carbon in the film. Thickness of the hard film of the piston ring used in this measurement was 50 μm and surface roughness of the film was 0.6 μmRz.

Measurement of carbon in the CrN film was mainly performed by EPMA and confirmed by ESCA.

Test conditions were as follows.
Lubricant oil: Hi-Diesel S3 10W Engine oil (NIPPON OIL CO., LTD.)
Load (P): 2.25 Kgf
Slide speed: Varied in a range of 0 m/s to 7 m/s
Slide distance: 360 m
Temperature: Room temperature Table 6 indicates the results of the test and a graph of the same results is given in FIG. 11.

TABLE 6

| carbon content of film (wt. %) | Slide speed when cracks occurred in the film (m/s) |
|---|---|
| 0.0 | 3.5 |
| 1.1 | 4.5 |
| 2.0 | 5.5 |
| 4.5 | 6.0 |
| 6.9 | 6.0 |
| 9.7 | 6.0 |
| 12.8 | 5.0 |

Figure 11:
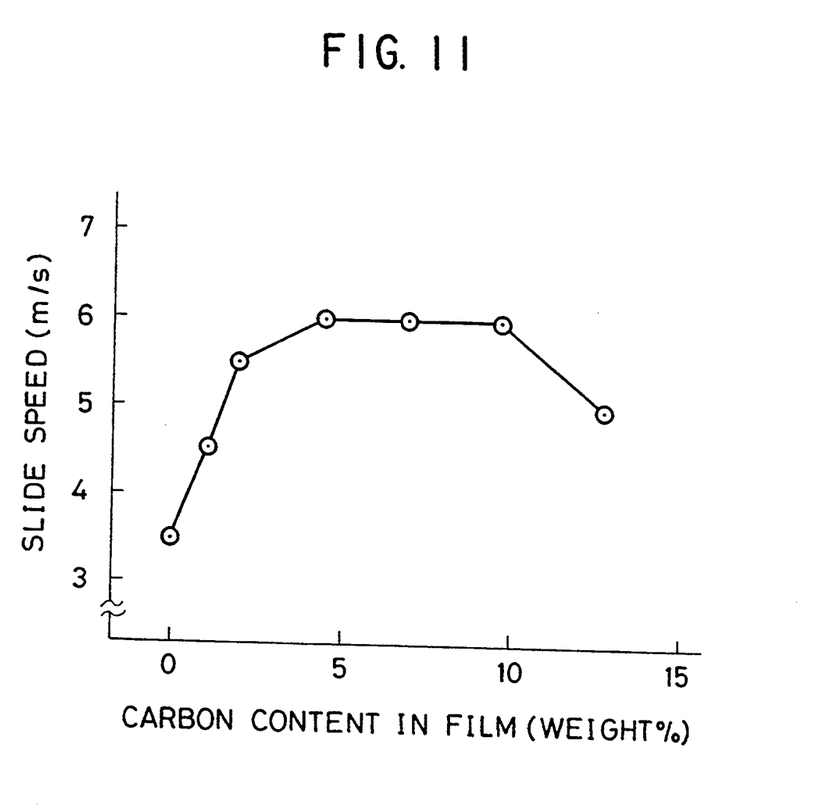
FIG. 11 is a graph showing the test results performed with a pin-on-cylinder friction testing machine.

As indicated by the test results in FIG. 11, toughness of the film during sliding was found to be improved by including carbon in the CrN.

In order to maintain sufficient toughness in the hard film in the preferred embodiment, the carbon content of the CrN was set in a range of 2 percent to 11 percent by weight.

The hard film is not high-density and contains defects such as pits at a hardness less than HV 1600. Since peeling may occur in the manufacturing process at a hardness in excess of HV 2200 HV, film hardness was set within a Vickers hardness range of 1600 to 2200.

Next, a scuffing evaluation test of the hard film was performed using the aforesaid high surface pressure scuffing testing machine.

When the load P was varied with the slide speed of the rotor 31 kept constant, the load when the pin 35 was scuffed was measured in the same manner as that described above. Scuffing tests were performed for pins (member for comparison) having, respectively, a hard chromium plating film, a nitrided layer of stainless steel, and a CrN film in which carbon is not included, and a pin (the present invention) provided with a CrN film in which carbon is included in a solid solution state under the following test conditions.

Figure 12:
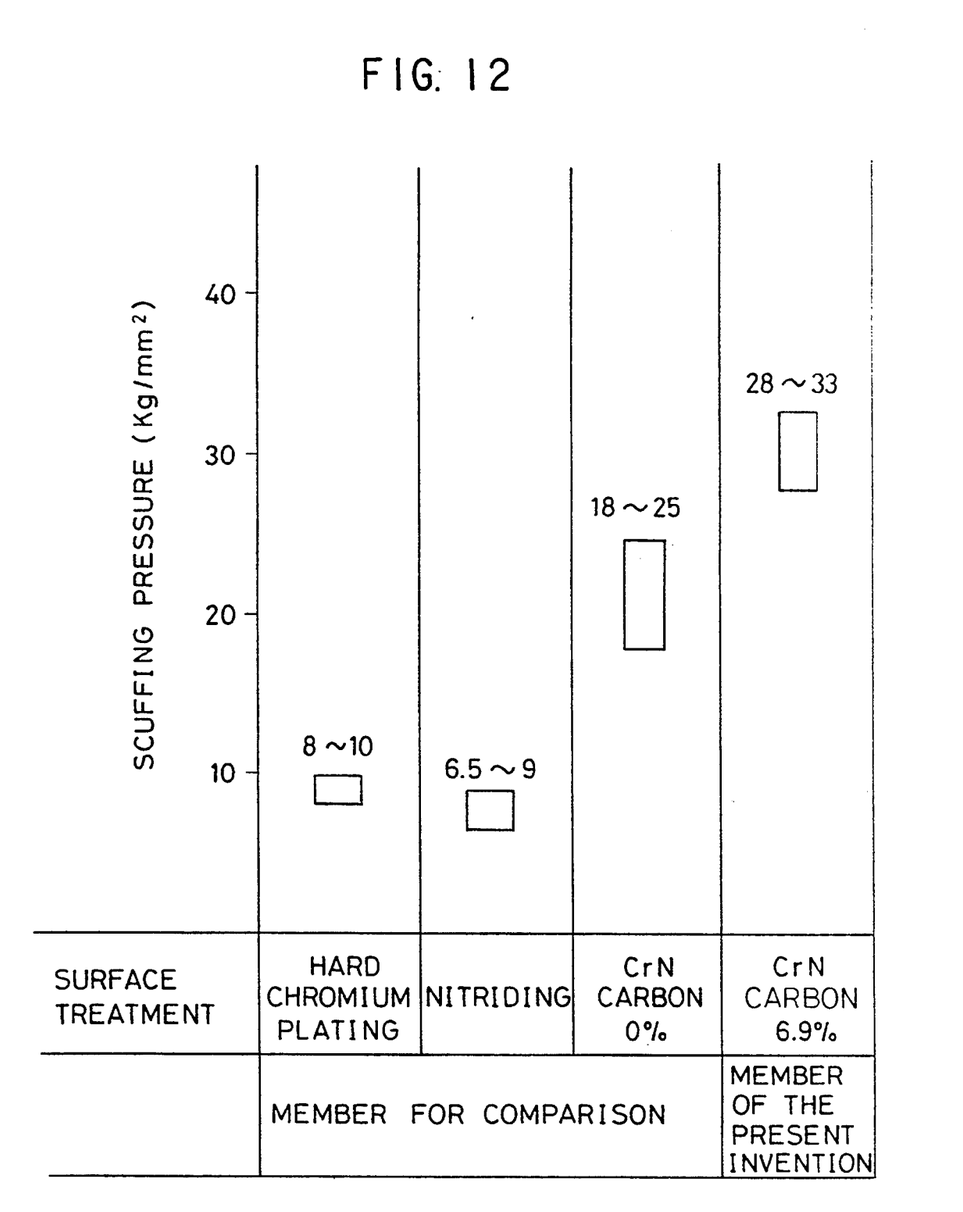
FIG. 12 is a graph showing the test results performed with a high surface pressure scuffing testing machine.

The test conditions were as follows.
Lubricant oil: Hi-Diesel S3 10W Engine oil (NIPPON OIL CO., LTD.); Oil temperature 80° C.
Load (P): Increased by 10 kgf from an initial load of 20 kgf at a time interval of 3 minutes
Slide speed: 8 m/s constant
Temperature : Room temperature As indicated by the test results in FIG. 12, it is apparent that the CrN film is superior to the hard chromium plating film or the nitrided layer in scuffing resistance. In addition, it is apparent that of the CrN film, the film of the present invention containing carbon is superior in scuffing resistance, to the film containing no carbon.

In the aforesaid preferred embodiments, although the hard film is applied to the piston ring, the hard film is not limited to piston ring applications. The hard film may be applied to cover at least the sliding surface of other sliding members, for example, a tappet or a cam used as a valve driving member in an internal combustion engine.

What is claimed is:

1. A hard coating material for a sliding member made of steel, cast iron, titanium or titanium alloy in which either 3 percent to 20 percent by weight of oxygen, or 2 percent to 11 percent by weight of carbon is included in a solid solution state in a crystal structure of CrN and the Vickers hardness of the hard coating material is in a range of 1600 to 2200.

2. A sliding member made of steel, cast iron, titanium or titanium alloy in which a hard film composed of the hard coating material of claim 1 is applied to cover at least the sliding surface of the sliding member.

3. A sliding member of claim 2 in which the member to which said hard film is applied is a piston ring and the surface where said hard film is formed is an outer circumferential surface of the piston ring.

4. A sliding member of claim 2 in which the member to which said hard film is applied is a piston ring and the surface where said hard film is formed is an outer circumferential surface, an upper surface and a lower surface of the piston ring.

5. A sliding member of claim 2 in which the member to which said hard film is applied is a piston ring and the surface where said hard film is formed is an outer circumferential surface, an upper surface, a lower surface and an inner circumferential surface of the piston ring.

* * * * *